(12) United States Patent
Vaucher

(10) Patent No.: US 7,739,069 B2
(45) Date of Patent: Jun. 15, 2010

(54) TEST PREPARED RF INTEGRATED CIRCUIT

(75) Inventor: Cicero Silveira Vaucher, Eindhoven (NL)

(73) Assignee: NXP B.V., Eindhoven (NL)

(*) Notice: Subject to any disclaimer, the term of this patent is extended or adjusted under 35 U.S.C. 154(b) by 423 days.

(21) Appl. No.: 11/910,186

(22) PCT Filed: Mar. 27, 2006

(86) PCT No.: PCT/IB2006/050924
§ 371 (c)(1),
(2), (4) Date: Sep. 28, 2007

(87) PCT Pub. No.: WO2006/103617
PCT Pub. Date: Oct. 5, 2006

(65) Prior Publication Data
US 2008/0208508 A1    Aug. 28, 2008

(30) Foreign Application Priority Data
Mar. 30, 2005    (EP) .................................. 05102523

(51) Int. Cl.
*G01R 31/28* (2006.01)
*G06F 11/27* (2006.01)
(52) U.S. Cl. .................... 702/120; 702/117; 702/124; 702/126; 324/765

(58) Field of Classification Search ................. 702/120, 702/117, 118, 124, 126, 189
See application file for complete search history.

(56) References Cited

U.S. PATENT DOCUMENTS

| 4,219,770 | A  | * | 8/1980  | Weinert ..................... 324/647 |
| 6,400,188 | B1 |   | 6/2002  | Baker et al. |
| 2002/0170003 | A1 |   | 11/2002 | Hirabayashi |
| 2003/0048142 | A1 |   | 3/2003  | Albean |
| 2003/0097614 | A1 |   | 5/2003  | Rajski et al. |
| 2004/0019449 | A1 | * | 1/2004  | Espinoza et al. ............ 702/117 |
| 2006/0111072 | A1 | * | 5/2006  | Kerth et al. ................. 455/302 |

OTHER PUBLICATIONS

R. Nelson "RF Test Join Soc Ate" Test and Measurement World, Apr. 1, 2002.

* cited by examiner

*Primary Examiner*—Hal D Wachsman

(57) ABSTRACT

In an example embodiment, an integrated circuit comprises a mixer circuit and a local oscillator circuit. During testing a frequency divider circuit in the integrated circuit divides a local oscillator signal to a frequency below a normal operating range of the local oscillator. The integrated circuit applies the divided local oscillator signal to the mixer circuit instead of the local oscillator signal during testing. Signal properties of a signal derived from the mixer circuit are measured while the divided local oscillator signal is applied to the mixer circuit.

9 Claims, 4 Drawing Sheets

US 7,739,069 B2

TEST PREPARED RF INTEGRATED CIRCUIT

FIELD OF INVENTION

The invention relates to a test prepared integrated circuit, in particular to an integrated circuit with components such as local oscillator circuits and mixer circuits for processing high frequency signals such as microwave signals. The invention also relates to a method of testing such an integrated circuit.

BACKGROUND

Testing of integrated circuits that contain a mix of RF circuits and logic circuits is described in an article by R. Nelson, titled "RF test join SOC ATE", published in Test and Measurement world dated Apr. 1, 2002. Increasingly, state of the art semi-conductor integrated circuit manufacturing techniques make it possible to produce integrated circuits with integrated capability of handling RF signals. "RF", as used herein, loosely refers to signals with frequencies used for wireless transmission, for example in microwave bands above 10 GHz, but also to lower frequency bands.

The main tests of RF circuits involves the application to the circuit of RF signals at frequencies that will be used during normal operation of the circuit, or measurement of such signals after their generation by the circuit. On the other hand, logic functions of integrated circuits are generally tested by applying logic test patterns and observing test responses at much lower frequencies. Test equipment for the latter type of test is generally standard in most integrated circuit manufacturing facilities and is applied to almost all more complex digital integrated circuits. On the other hand equipment for RF testing is not widely available and implies additional investment if integrated circuits with RF circuits have to be manufactured and tested.

SUMMARY OF INVENTION

Among others, it is an object of the invention to provide for a test prepared integrated circuit that facilitates testing of RF circuit components without special RF testing equipment.

In an example embodiment, the invention provides for a test prepared integrated circuit. The integrated circuit uses a test control input to control replacement of a local oscillator signal by a signal with a divided-down frequency during testing. Preferably, the integrated circuit comprises a test function block with a frequency divider circuit that is provided for this purpose. Preferably, this circuit is disabled during normal operation. The test control input may be a dedicated pin of the integrated circuit that is coupled to a test control block that implements the substitution. Alternatively, the test control input may be an internal line from a test control circuit in the integrated circuit, the test control circuit being part of a scan test interface for example, for generating the control signal to control substitution, or the test control input may come from some other command interface circuit in the integrated circuit.

In an embodiment the integrated circuit comprises a quadrature mixing circuit. In this embodiment an output signal of the frequency divider circuit may be substituted at both I and Q inputs for the local oscillator in the mixing circuit. In a further embodiment a switching circuit is provided to minimize disturbance of the phase relationships of quadrature local oscillator output signals.

The invention also provides for a method of testing wherein a divided local oscillator signal is applied to the mixer circuit instead of the local oscillator signal at a frequency that is lower than the frequency or frequencies that are supplied to the mixing circuit that are supplied to the mixing circuit during normal (non-test) operation.

BRIEF DESCRIPTION OF THE DRAWINGS

These and other objects and advantageous aspects of the invention will be described using examples of embodiments illustrated in the accompanying figures.

DETAILED DESCRIPTION

Figure 1:
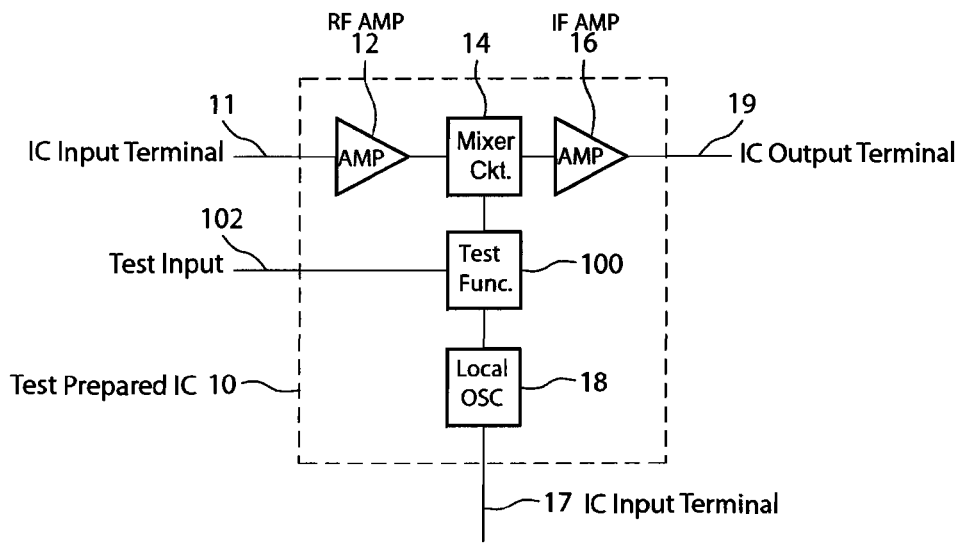
FIG. 1 schematically shows a test prepared integrated circuit

FIG. 1 schematically shows a test prepared integrated circuit 10. Integrated circuit 10 comprises an RF amplifier circuit 12, a mixer circuit 14, an IF amplifier circuit 16, a local oscillator circuit 18, and a test function block 100. An input terminal 11 of integrated circuit 10 is coupled to an input of RF amplifier circuit 12. An output of RF amplifier circuit 12 is coupled to a first input of mixer circuit 14. An output of mixer circuit 14 is coupled to an input of IF amplifier circuit 16, which has an output coupled to an output terminal 19 of integrated circuit 10. In an alternative embodiment integrated circuit 10 can be an RF generating circuit, wherein amplifier circuit 12 is an IF amplifier circuit and amplifier circuit 16 is an RF amplifier circuit. Local oscillator circuit 18 has an output coupled to a signal input of test function block 100, which in turn has an output coupled to a second input of mixer circuit 14. Local oscillator circuit 18 has a control input coupled to an input terminal 17 of the integrated circuit 10. Test function block 100 has a control input coupled to a test terminal 102 of integrated circuit 10.

Figure 2:
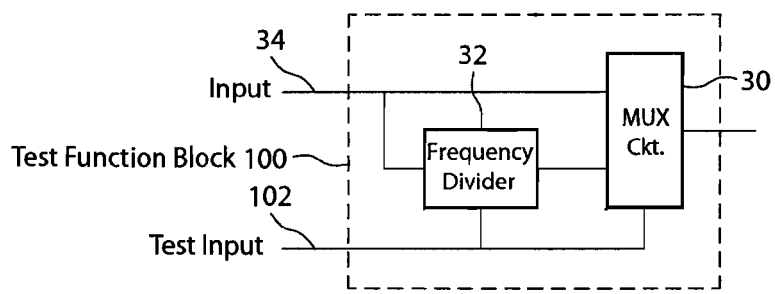
FIG. 2 shows an embodiment of a test function block

FIG. 2 shows a test function block 100. Test function block 100 comprises a frequency divider circuit 32 and a multiplexer circuit 30. The input 34 of test function block 100 that is coupled to the local oscillator circuit (not shown) is coupled to an input of frequency divider circuit 32 and to a first input of multiplexer circuit 30. An output of frequency divider circuit 30 is coupled to a second input of multiplexer circuit 30. An output of multiplexer circuit 30 is coupled to the second input if the mixer circuit (not shown). Test terminal 102 of the integrated circuit is coupled to a control input of multiplexer circuit 30 and to an enable input of frequency divider circuit 32.

Figure 3:
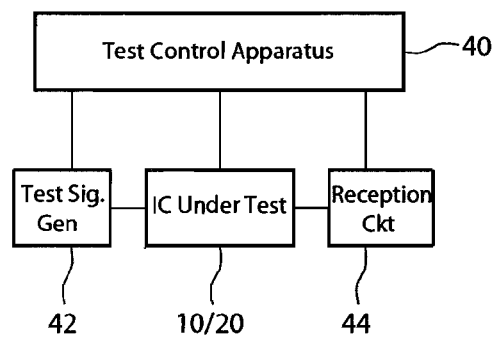
FIG. 3 shows a test environment

FIG. 3 shows a test environment comprising a test control apparatus 40, a test signal generator 42, a reception circuit 44 and an integrated circuit under test 10. Test control apparatus 40 has outputs coupled to test signal generator 42, integrated circuit under test 10 and reception circuit 44. Test signal generator is coupled to an input terminal 11 of integrated circuit under test 10. An output terminal 19 of integrated circuit under test 10 is coupled to reception circuit 44.

The terms RF (radio frequency) and IF (intermediate frequency) as used herein are not to be considered as limiting to specific frequency ranges. Typically RF refers to frequencies used for wireless transmission to or from an apparatus that contains integrated circuit 10, and IF refers to auxiliary lower frequencies used inside that apparatus during reception or generation of the RF signal (typically at a higher frequency than logic signals, but in direct conversion circuits the IF band may be near zero frequency).

In normal operation test function block 100 passes signals from local oscillator circuit 18 to mixer circuit 14. Frequency divider circuit 32 is disabled and multiplexer circuit 30 is made to pass the signal from its first input, i.e. directly from local oscillator circuit 18. This can be ensured for example by mounting integrated circuit 10 on an integrated circuit board that has conductor tracks arranged to apply voltage corresponding to "no-test" to test terminal 102, or by bonding this terminal in the integrated circuit 10 so that a "no-test" signal is applied.

Figure 4:
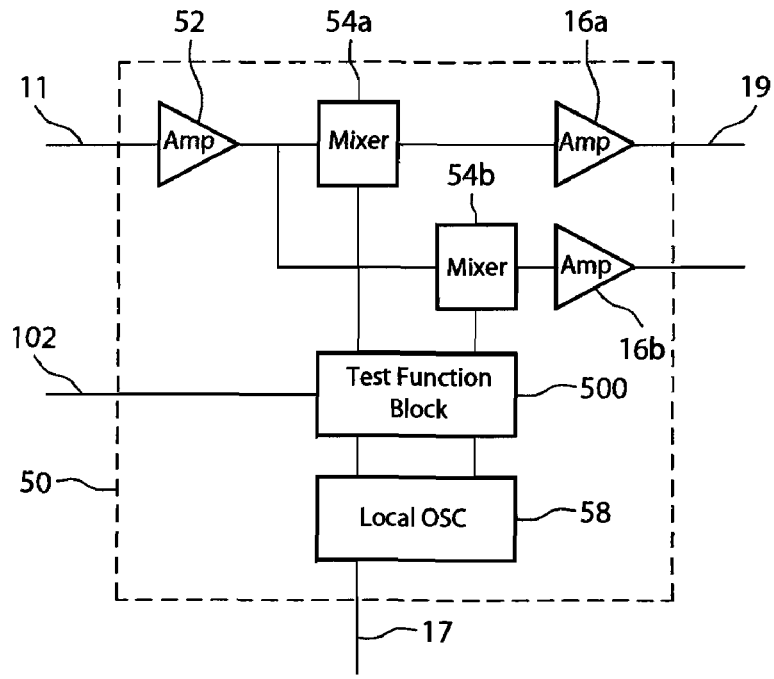
FIG. 4 schematically shows a test prepared integrated circuit

During testing integrated circuits are temporarily coupled to test control apparatus 40, a test signal generator 42, a reception circuit 44 as shown in FIG. 4. Thereupon test control apparatus 40 applies a control signal to test terminal 102 to control test function block 100 to substitute a divided down version of the local oscillator signal at the second input of mixer circuit 14. Frequency divider circuit 30 divides the frequency of the signal from local oscillator 18 by a predetermined factor.

The factor is selected so that, in the case of a receiver integrated circuit 10, mixer circuit 14 generates an IF signal in the normal frequency band of IF amplifier circuit 16 when an input signal with lower than normal frequency is applied to RF amplifier circuit 12. Preferably, the factor is such that the required frequency of the input signal during test is in a frequency range of conventional test signal generators 42 that are available at semi-conductor manufacturing sites.

Currently, for example generators for generating signals with a frequency of about 3.5 GHz are available, so that a division factor of four may be used for integrated circuits that are intended to work with a local oscillator frequency of about 9.75 GHz for Ku-band satellite receiver circuits (with input frequencies in a range of 10.7 to 12.75 GHz and IF frequencies of about 1 GHz). For an integrated circuit 10 for receiving input signals with a frequency of about 24 GHz a division factor of eight or even sixteen may be used for the local oscillator signal during testing so that an input signal with a frequency in a range of about 1.5 to 3 GHz can be used during testing. It may be necessary in this case to take measures to avoid problems due to direct feed through through mixer 14, for example by including filtering circuits for these frequencies in the test setup. However, it will be clear that other division factors may be used, dependent on the available test signal generators and the normal operating frequency of the local oscillator circuit 18.

Similarly, in the case of an integrated circuit 10 with an RF output, mixer circuit 14 generates an RF signal in the normal frequency band of reception circuits 44 that are available at semi-conductor manufacturing sites. Division factors similar to those for the reception integrated circuit may be used.

FIG. 4 shows a further integrated circuit 50 wherein mixer circuits 54*a,b* generate quadrature signals by mixing the input signal from an input amplifier 52 with two quadrature output signals of local oscillator circuit 58. Typically integrated circuit 50 is a receiver circuit, so that its input amplifier 52 is an RF amplifier and output amplifiers 56*a,b* at the output of mixers 54*a,b* are IF amplifiers. But alternatively, input amplifier 52 may be an RF amplifier and output amplifiers 56*a,b* may be RF amplifiers. In each case the local oscillator signals from a local oscillator circuit 58 in integrated circuit 50 are passed through a test function block 500 in integrated circuit 50.

Figure 5:
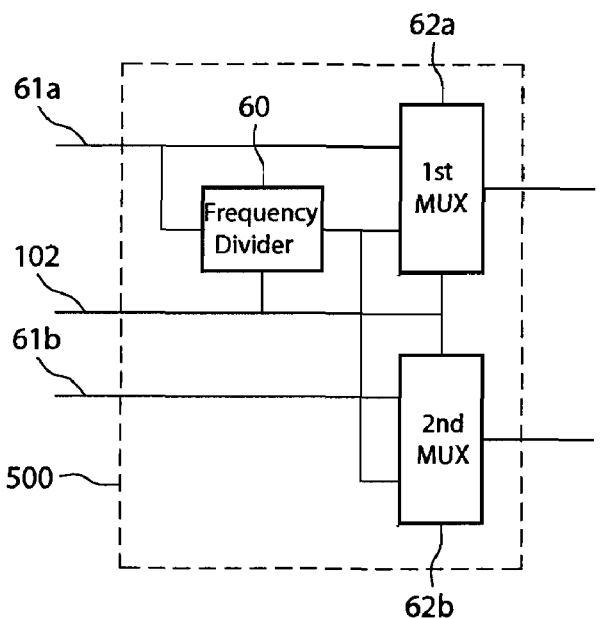
FIG. 5-7 show further embodiments of a test function block

FIG. 5 shows a first embodiment of test function block 500 for use in the integrated circuit of FIG. 4. Test function block 500 has a first and second input 61*a,b* for respective local oscillator signals and two outputs 66*a,b* for applying signals to respective mixer circuits (not shown). Test function block 500 comprises a frequency divider circuit 60 and a first and second multiplexer circuit 62*a,b*. Inputs 61*a,b* are coupled to first inputs of first and second multiplexer circuit 62*a,b* respectively. First input 61*a* is coupled to an input of frequency divider circuit 60, which has an output coupled to second inputs of first and second multiplexer circuit 62*a,b*. A test control input 102 is coupled to control inputs of first and second multiplexer circuit 62*a,b* and to an enable input of frequency divider circuit 60.

In normal operation a test control signal is applied to test control input 102 that makes first and second multiplexer circuit 62*a,b* pass signals from local oscillator circuit 58 directly and frequency divider circuit 60 is disabled. During test operation a test control signal is applied that enables frequency divider circuit 60 and makes first and second multiplexer circuit 62*a,b* pass a divided signal from frequency divider circuit 60 to mixer circuits 54*a,b*.

As can be appreciated this embodiment realizes the advantage of a lower frequency RF signal during test for a quadrature circuit.

Figure 6:
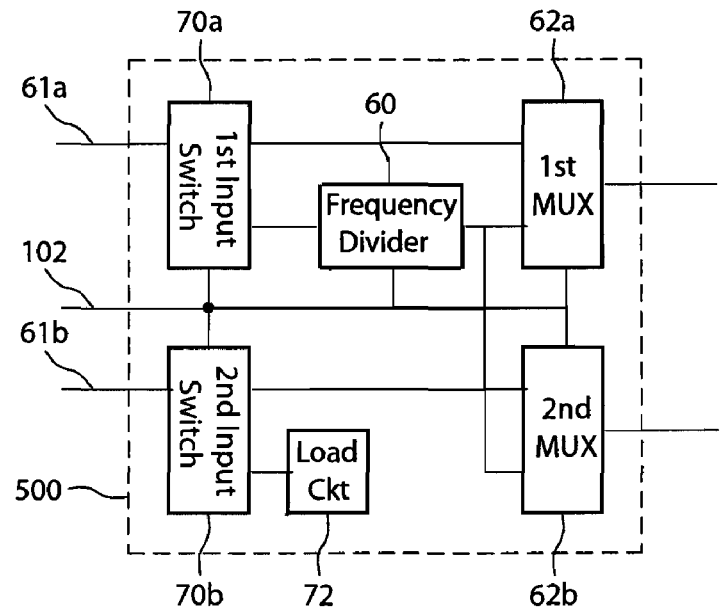

FIG. 6 shows a second embodiment of test function block 500 for use in the integrated circuit of FIG. 4. Here, additional input switches 70*a,b* have been inserted in integrated circuit 50 between the inputs 61*a,b* for receiving signals from the local oscillator circuit (not shown) on one hand and frequency divider circuit 60 and multiplexer circuits 62*a,b* on the other hand. First input switch 70*a* has a first output coupled the first input of first multiplexer 62*a* and a second output coupled to the input of frequency divider circuit 60. Second input switch 70*b* has a first output coupled the first input of second multiplexer 62*a*. Test function block comprises a load circuit 72 coupled to the second output of second input switch 70*b*. Load circuit 72 is constructed to provide an impedance similar to that of frequency divider circuit 60, when disabled. Input switches 70*a,b* have control inputs coupled to test control input 102.

In operation, input switches 70*a,b* couple inputs 61*a,b* to the first inputs of multiplexer circuits 62*a,b* when the test control signal signals normal operation and to frequency divider circuit 60 and load circuit 72 respectively when the test control signal signals test operation. The embodiment of FIG. 6 equalizes the loads presented by test function block 500 to local oscillator circuit 58, to minimize disturbance of the quadrature relationship of the signals at the outputs of local oscillator circuit 58.

It will be noted that both embodiments of test function block 500 apply in-phase local oscillator signals to mixer circuits 54*a,b* during test. Typically, this is not problem when the outputs of output amplifiers 56*a,b* can be monitored separately during test. A minimum of circuit overhead is required since only a single additional frequency divider circuit 60 is required for test purposes.

Figure 7:
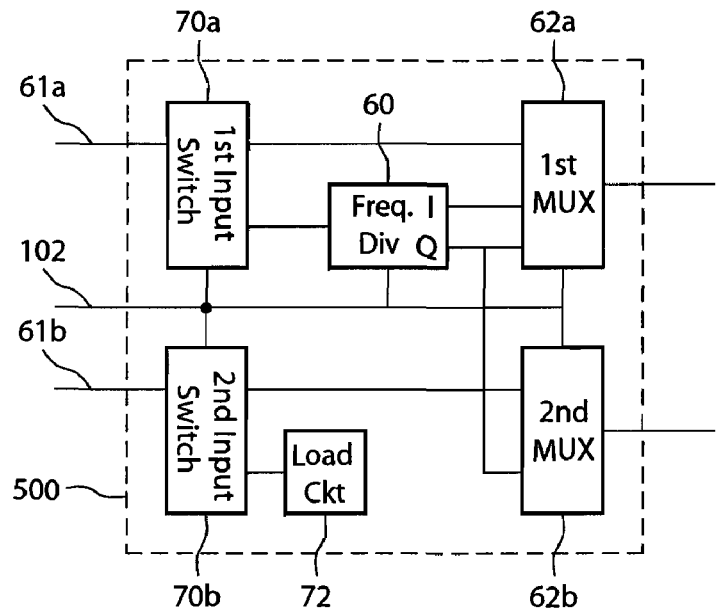

FIG. 7 shows an alternative wherein a frequency divider circuit is used that produces quadrature output signals and applies these to the second inputs of the first and second multiplexer circuit 62*a,b* respectively. In this way, the integrated circuit can be tested using quadrature signals. This may be advantageous if the integrated circuit comprises further circuits (not shown) that combine the output signals of output amplifiers 56*a,b*, for testing these further circuits, or if faults that show up due to cross-effects between the output signals of mixer circuits 54*a,b* must be tested for.

In a further embodiment test function block 500 for the quadrature circuit comprises a pair of test function blocks as shown in FIG. 2, each coupled between a respective output of local oscillator circuit 58 and the input of a respective mixer circuit 54a,b. This requires more overhead, but allows testing of both outputs of local oscillator circuit 58. As an alternative an input multiplexing circuit (not shown) may be used for coupling either one of the outputs of local oscillator circuit 58 to the input of frequency divider circuit 62 during test, under control of an additional test control signal.

Any known type of frequency divider circuit may be used for frequency divider circuits 30, 60. Preferably, they are implemented for example as chain of divide by two circuits. Preferably, the division factor is a power of two, since such factors can be implemented at the highest frequencies with a minimum circuit overhead (and risk of faults in the frequency divider circuit). Frequency divider circuits with quadrature outputs are also known per se. Divide by two circuits that react to mutually opposite signal transitions may be used in parallel as the last stage of a chain of divide by two circuits for example.

Multiplexing circuits 30, 62a,b circuits are preferably realized using controllable switches that connect selected inputs to the output of selected multiplexing circuits 30, 62a,b, so that current flows from the selected input to the selected output. Alternatively, selectively enabled buffer circuits may be used in multiplexing circuits 30, 62a,b for example.

Local oscillator circuit 18, 28, 58 may be of any known type. A frequency synthesizer circuit may be used, for example a circuit with a phase locked loop wherein the frequency of the local oscillator signal is divided down by a programmable factor and the divided down signal is locked onto a reference signal. In an embodiment, the frequency divider circuit 32 that is used for test purposes is part of such a frequency synthesizer, preferably a front part of a divider that divides down an oscillator frequency for supply to a phase detector. In this case, multiplexing circuit 30 provides for an additional connection between a node inside such a frequency synthesizer circuit and mixer circuit 14, the additional connection being activated under control of a test control signal. In other embodiments a frequency divider circuit may be used that can also supply signals to mixer circuit 14 during normal operation, using a test control input to activate a connection from the frequency divider circuit in response to a test control signal.

In an embodiment the test control signal is provided via a dedicated test control pin or bonding pad of the integrated circuit to test function block directly (i.e. without passing through a further circuit that determines whether or not to pass the test control signal to test function block 100). Alternatively, the test control signal may be supplied via a command bus of the integrated circuit.

Figure 8:
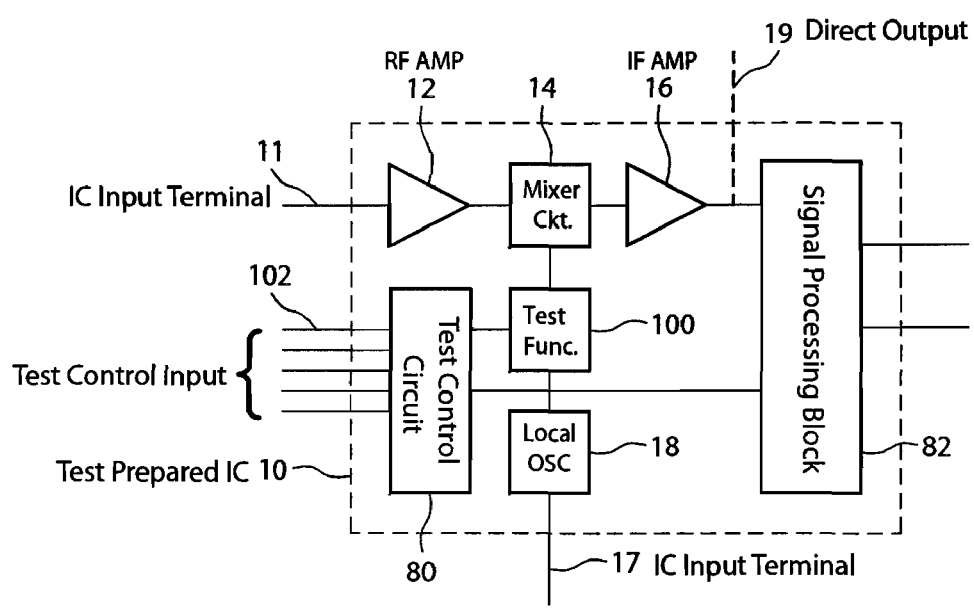
FIG. 8 schematically shows a test prepared integrated circuit

FIG. 8 shows an embodiment comprising a test control circuit 80 and signal processing circuits 82. Test control circuit 80 is coupled to test interface pins of the integrated circuit (for example of a scan test interface, with a test data in pin TDI, a test data out pin TDO, a test clock pin TCK, a test mode select pin TDS and a reset pin TRST). Test control circuits 80 are known per se and it is also known to design such circuits to output control signals in response to data that is received from a test data pin, or in response to state switches that are controlled by a test mode selection signal. In an embodiment such a control signal is used to control test function block 100, or a test function block for a quadrature circuit. Thus, no dedicated pin is needed to control testing by test function block 100. Alternatively some command interface of the integrated circuit, such as a known I2C interface may be used to supply test control signals, or the integrated circuit could be arranged so that when it is switched into a test mode any terminal of the integrated circuit that is normally used for some functional purpose is used as control input of the integrated circuit.

Signal processing circuits 82 may be included in the integrated circuit that process the output signal of mixer circuit 14, e.g. by further mixing and/or detection of data. In this case a direct output 19 from mixer circuit 14 is preferably provided at a bond flap or pin of the integrated circuit for test purposes, to allow spectrum analysis of the mixed signal during testing. In addition (or alternatively) captured test data from the signal processing circuits 82 may be fed to test control circuit 80 for output via the test interface during testing.

In a RF generator integrated circuit signal processing circuits may be provided in front of mixer circuit 14 and may be similarly coupled to test control circuit 80 to control the generation of different IF signals for test purposes.

Preferably test control apparatus 40 is arranged to apply various control signals to the control input of local oscillator circuit 18, 28, 58, e.g. to select different local oscillator output frequencies, in addition to applying the test control signal to test function block 100, 500. In this way the response of local oscillator circuit 18, 28, 58 to such control signals can be tested by monitoring the resulting output signals from mixer circuits 14, 24, 54.

Reception circuit 44 comprises for example a spectrum analyser for measuring properties of a frequency spectrum of the output signal of the integrated circuit. Test control apparatus 40 receives results of this measurement, and generates a positive test result signal if the result is within a predetermined range and a negative test result signal otherwise.

Although examples have been shown for integrated circuits wherein only one input signal (RF or IF) is received, it should be appreciated that the invention may be applied to integrated circuits that receive more signals, for example to integrated circuits that implement both a receiver (RF in IF out) and a generator (IF in RF out), possibly with a common local oscillator circuit, or circuits that process IF signals so that only data signal are input and/or output. In this case provisions can be made to test all mixer circuits in the described way when the integrated circuit is switched to the test mode. Alternatively the mixer circuits can be tested one by one.

The invention claimed is:

1. A test prepared integrated circuit that is switchable to a normal operating mode and a test mode, the test prepared integrated circuit comprising:

a test control input for supplying a test control signal to indicate whether the integrated circuit should operate in the normal operating mode or the test mode;

a local oscillator circuit with a local oscillator output, the local oscillator output generating an oscillator signal of a predetermined frequency;

a mixer circuit having an input and an output;

a frequency divider circuit with an input coupled to the local oscillator output, and a frequency divider output and a test input coupled to the test control input, the frequency divider circuit dividing the frequency of the oscillator signal by a predetermined factor;

a first multiplexing circuit with signal inputs coupled to the local oscillator output and the frequency divider output and an output coupled to the mixer circuit, the first multiplexing circuit having a control input coupled to the test control input, the multiplexing circuit being arranged to couple the local oscillator output to the input of the mixer circuit in the normal operating mode, and to couple the frequency divider output instead of the local oscillator output to the input of the mixer circuit in the test mode.

2. A test prepared integrated circuit according to claim 1, wherein the local oscillator circuit has a quadrature output in addition to said local oscillator output, the integrated circuit further comprising a further mixer circuit, the further multiplexing circuit having a further input coupled to the quadrature output and a further output coupled to the further mixer circuit, the first multiplexing circuit being arranged to couple the quadrature output to the further mixer circuit in the normal operating mode, and to feed a divided output signal from the frequency divider circuit to the further mixer circuit instead in the test mode.

3. A test prepared integrated circuit according to claim 2, wherein the frequency divider circuit has a quadrature divider output in addition to the divider output, the frequency divider circuit being arranged to produce divided signals in quadrature relationship at the divider output and the quadrature divider output from a common local oscillator signal, the multiplexing circuit having a second further input coupled to the quadrature divider output, the multiplexing circuit deriving an output signal for the further mixer circuit from the quadrature divider output.

4. A test prepared integrated circuit according to claim 2 wherein the divided output signal for substitution at both the mixer circuit and the further mixer circuit is derived from the divider output.

5. A test prepared integrated circuit according to claim 2, further comprising
a load circuit with a terminal;
a switching circuit with first terminals coupled to the local oscillator output and the quadrature output and second terminals coupled to the input of the frequency divider circuit, the terminal of the load circuit, and the signal inputs of the multiplexing circuit, and
a control input coupled to the test control input, the switching circuit being arranged to couple the local oscillator output and the quadrature output to the signal inputs of the multiplexing circuit in the normal operating mode and to couple the local oscillator output and the quadrature output to the input of the frequency divider circuit and the terminal of the load circuit respectively in the test mode.

6. A test prepared integrated circuit according to claim 1, wherein the frequency divider circuit has a disable input coupled to the test control input and the frequency divider circuit is arranged to suppress a division of the local oscillator signal in the normal operating mode.

7. A method of testing an integrated circuit that comprises a mixer circuit and a local oscillator circuit, the method comprising
attaching the integrated circuit to a test apparatus;
switching the integrated circuit to a test configuration, wherein a frequency divider circuit in the integrated circuit divides a local oscillator signal to a frequency below a normal operating range of the local oscillator circuit in the integrated circuit and applies the divided local oscillator signal to the mixer circuit instead of the local oscillator signal;
measuring a property of a signal derived from the mixer circuit while the divided local oscillator signal is applied to the mixer circuit.

8. A method according to claim 7, wherein the signal derived from the mixer circuit is a down-converted IF signal.

9. A method according to claim 7, wherein the signal derived from the mixer circuit is an up-converted RF signal.

* * * * *